United States Patent
Park et al.

(10) Patent No.: US 6,593,162 B1
(45) Date of Patent: Jul. 15, 2003

(54) METHOD OF MANUFACTURING SEMICONDUCTOR OPTICAL DEVICE

(75) Inventors: Kyung Hyun Park, Daejon-Shi (KR); Yong Soon Baek, Daejon-Shi (KR); Sung Bock Kim, Daejon-Shi (KR); Kwang Ryong Oh, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/185,137

(22) Filed: Jun. 27, 2002

(30) Foreign Application Priority Data

Feb. 21, 2002 (KR) .......................................... 2002-9177

(51) Int. Cl.⁷ .............................................. H01L 21/00
(52) U.S. Cl. ............................... 438/31; 438/40; 438/47
(58) Field of Search ..................... 438/23, 24, 29, 438/31, 32, 36, 40, 43, 47

(56) References Cited

U.S. PATENT DOCUMENTS

| | | | |
|---|---|---|---|
| 4,990,466 A | * | 2/1991 | Shieh et al. .................. 438/47 |
| 5,138,626 A | * | 8/1992 | Yap ............................... 438/36 |
| 5,208,821 A | * | 5/1993 | Berger et al. .................. 438/43 |
| 5,756,373 A | * | 5/1998 | Sakata .......................... 438/24 |
| 5,783,844 A | * | 7/1998 | Kobayashi et al. ......... 257/103 |
| 5,863,809 A | | 1/1999 | Koren |
| 6,025,207 A | | 2/2000 | Mersali et al. |

OTHER PUBLICATIONS

IEEE Photonics Technology Letters, vol. 11, No. 1, Jan. 1999, pp. 81–83.
Electronics Letters, Oct. 24, 1996, vol. 32, No. 22 pp. 2076–2078.

* cited by examiner

Primary Examiner—Chandra Chaudhari
(74) Attorney, Agent, or Firm—Blakely Sokoloff Taylor & Zafman

(57) ABSTRACT

The present invention relates to a method of manufacturing a semiconductor optical device. The present invention discloses a method of manufacturing an optical device of a planar buried heterostructure (PBH) type by which an active layer region of a taper shape at both ends is patterned, an undoped InP layer is selectively grown in order to reduce the propagation loss and two waveguides are simultaneously formed by means of a self-aligned method, thus simplifying the process to increase repeatability and yield.

8 Claims, 7 Drawing Sheets

METHOD OF MANUFACTURING SEMICONDUCTOR OPTICAL DEVICE

BACKGROUND OF THE INVENTION

1. Field of the Invention

The invention relates generally to a method of manufacturing a semiconductor device, and more particularly to, a method of manufacturing a semiconductor optical device of a planar buried heterostructure (hereinafter called 'PBH') type in which a mode converter is integrated.

2. Description of the Prior Art

A semiconductor optical amplifier is usually used as a functional device of a wavelength division multiplexing (WDM) optical communication network. There has recently been made a lot of research and development on the semiconductor optical amplifier. The type of the semiconductor optical amplifier can be functionally classified into a mode converter for reducing the optical loss caused when a semiconductor optical device and an optical fiber are coupled, and one in which current is injected into an active layer for the purpose of the gain of a semiconductor optical device.

The mode converter (or mode expander) is to reduce the optical loss that is caused when the semiconductor optical device and the optical fiber are coupled. The optical loss is generated when a mode of the optical fiber of about 8~10 $\mu m_2$ in the mode size and a mode of the optical device of about 1×0.5 $\mu m_2$ in the mode size due to a large refractive index of the semiconductor is mismatched. The above optical loss requires an optical alignment of a higher degree upon an optical packaging, and also greatly affects the characteristics of an active optical device due to a reflecting light caused in the cross section of the optical device. Therefore, research has recently been made on a mode converter integrated optical device in order to reduce the cost and accomplish single integration between the optical devices.

Next, in case of the one in which current is injected into the active layer for the purpose of the gain of the semiconductor optical device, the two waveguides are different in the width and have a vertical type in space, in the optical device having two waveguides as a basic structure. Therefore, there is a problem in technically regrowing an electrical isolation layer and in repeatability, etc. accordingly.

In order to solve these problems, U.S. Pat. No. 6,025,207 discloses a method of simplifying the process by improving the electrical isolation layer. FIG. 1 is a cross-sectional view of an optical device of a buried ridge structure (hereinafter, called 'BRS') disclosed in the U.S. Pat. No. 6,025,207.

Referring now to FIG. 1, the optical device of BRS type in the U.S. Pat. No. 6,025,207 includes, as basic components, an optical waveguide layer 102 for integration and an active layer 104. A p-InP layer 106 for current injection is regrown on the entire structure. A proton 108 is injected into regions except for the active layer 104 using the ion implanter and current is injected into the active layer 104 in order to simplify the process for integration. Further, an InGaAs layer 110 into which a p type impurity is doped and having a high conductivity as an ohmic layer is formed. An electrode 112 is formed to complete the optical device. However, as there exists the difference in the width of current injection and in the width of the active layer, electrons are leaked to the p-InP layer 106 when high current is injected. As the InP layer 106 into which a p type impurity is doped is regrown on the first waveguide in regions except for the active layer 104, the propagation loss occurs. There is a problem that the propagation loss degrades the characteristic of an active optical device. In FIG. 1, unexplained reference numerals 100, 101 and 103 indicate a substrate, a buffer layer, and a medium layer into which a n type impurity of a high concentration is doped, respectively.

U.S. Pat. No. 5,863,809 discloses a method of reducing this propagation loss. FIG. 2 is a cross-sectional view of an optical device of a buried ridge structure (BRS) type disclosed in the U.S. Pat. No. 5,863,809.

Referring now to FIG. 2, waveguide layers 202 and 204, and an active layer 206 are first grown. A waveguide of the active layer 206 is then formed using photolithography and etching. An undoped layer 210 is regrown on the entire surface to reduce the propagation loss.

Further, the undoped layer 210 on the active layer 206 is etched by means of photolithography so that current can be injected into only the active layer 206. InP layers 214 and 212 being an electrical isolation layer and being doped by p/n/p type, are formed in regions except for the active layer 206. The U.S. Pat. No. 5,863,809 can obtained a current isolation characteristic using the undoped InP layer 210. However, the patent has a disadvantage that current is distributed due to the thickness of the undoped layer 210. In addition, as photolithography and etching process are performed several times, repeatability is degraded and the yield is thus reduced. Considering that the yield of the optical devices is very lower than that of electronic devices, reduction in the yield must be solved. In FIG. 2, unexplained reference numerals 207, 208, 216, 218 and 220 indicate a p-InP layer, an etch stop layer, an upper p-InP layer, a contact layer and a contact pad, respectively.

SUMMARY OF THE INVENTION

The present invention is contrived to solve the above problems and an object of the present invention is to provide a method of manufacturing a semiconductor optical device having a PBH (planar buried heterostructure) type of a good characteristic, capable of reducing the propagation loss, simplifying the process using a self-aligned method, and increasing the repeatability and yield.

In order to accomplish the above object, a method of manufacturing a semiconductor optical device according to the present invention, is characterized in that it comprises the steps of sequentially forming a first waveguide layer, a first clad layer, a second waveguide layer and a second clad layer on a semiconductor substrate; depositing a first hard mask on the second clad layer and then forming a first hard mask pattern having a taper shape at both ends; etching the second clad layer and the second waveguide layer using the first hard mask pattern as an etch mask; selectively growing an undoped InP layer at regions from which the second clad layer and the second waveguide layer are etched using the first hard mask pattern as a selective mask and then patterning the undoped InP layer; removing the first hard mask pattern; forming a second hard mask pattern the width of which is smaller than the width of the first hard mask pattern on a result from which the first hard mask is removed; and etching the undoped InP layer, the second clad layer, the second waveguide layer, the first clad layer and the first waveguide layer using the second hard mask pattern as an etch mask to simultaneously form a second waveguide layer and a first waveguide layer having different widths.

The method of manufacturing a semiconductor optical device according to the present invention, is characterized in that it can further comprises the steps of, after the step of etching the undoped InP layer, the second clad layer, the second waveguide layer, the first clad layer and the first waveguide layer using the second hard mask pattern as an etch mask, forming an electrical isolation layer at regions where the undoped InP layer, the second clad layer, the second waveguide layer, the first clad layer and the first waveguide layer are etched; removing the second hard mask pattern; forming an upper clad layer on a result from which the second hard mask pattern is removed; depositing an electrically conductive layer on the upper clad layer and then patterning the electrically conductive layer in order to inject current into the second waveguide layer; forming a silicon nitride film on a result in which the electrically conductive layer is pattern and then etching the silicon nitride film in order to electrically connect the electrically conductive layer and an electrode, thus forming an opening portion; and forming an electrode electrically connected to the electrically conductive layer.

The electrical isolation layer is formed by growing an InP layer in a p/n/p type.

The first waveguide layer is formed to be a n-InGaAsP layer, the second waveguide layer is formed to be an undoped InGaAsP layer, the first clad layer is formed to be a n-InP layer, and the second clad layer is formed to be a p-InP layer.

An InGaAsP layer is further formed at lower and upper sides of the second waveguide layer for separate confinement heterostructure and uniform gain depending on polarization.

The widths at the central portion and edge of the second hard mask pattern are different, the width at the edge of the second mask pattern is wider than the width at the central portion of the second mask pattern, the width of the central portion of the second mask pattern is narrower than the wide of the fist hard mask and the boundary at the central portion and the edge of the second mask pattern is tapered The etching process using the second hard mask pattern as an etch mask includes first performing a dry etching process to etch by a given depth and then performing a wet etching process.

The first and second hard masks are formed to be a silicon nitride film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
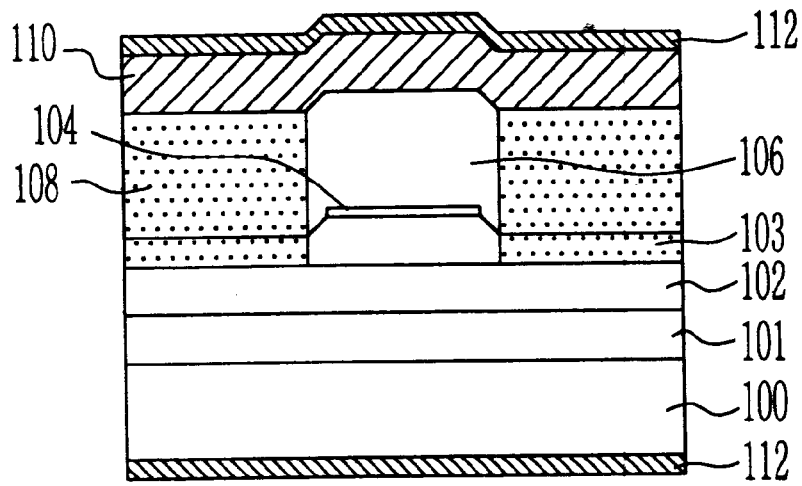
FIG. 1 is a cross-sectional view of a conventional optical device of a buried ridge structure (BRS) type for explaining a method of manufacturing the optical device.
Figure 2:
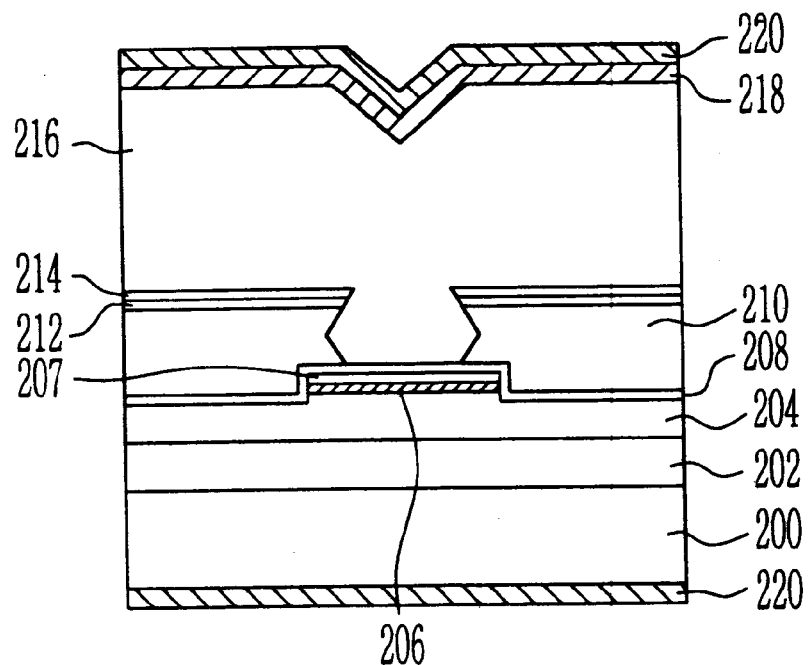
FIG. 2 is a cross-sectional view of another conventional optical device of a buried ridge structure (BRS) type for explaining a method of manufacturing the optical device.

The present invention will be described in detail by way of a preferred embodiment with reference to accompanying drawings, in which like reference numerals are used to identify the same or similar parts.

If one layer described in the following exists on the other layer, the one layer may exist on immediately on another layer. A third layer may be intervened between the one layer and the other layer. Further, in the drawings, the thickness and size of each of layers are expanded for convenience of explanation and clarity. Similar reference numerals indicate similar components.

FIG. 3~FIG. 11 are cross-sectional views of a PBH-type semiconductor optical device for explaining a method of manufacturing the semiconductor optical device according to a preferred embodiment of the present invention. In the drawings, FIGS. 3A, 4A, 5A, 6A, 7A, 8A, 9A, 10A and 11A are plan views of the optical devices. FIGS. 3B, 4B, 5B, 6B, 7B, 8B, 9B, 10B and 11B are cross-sectional views of the optical devices taken along lines a—a' in FIGS. 3A, 4A, 5A, 6A, 7A, 8A, 9A, 10A and 11A, respectively.

Figure 3A:
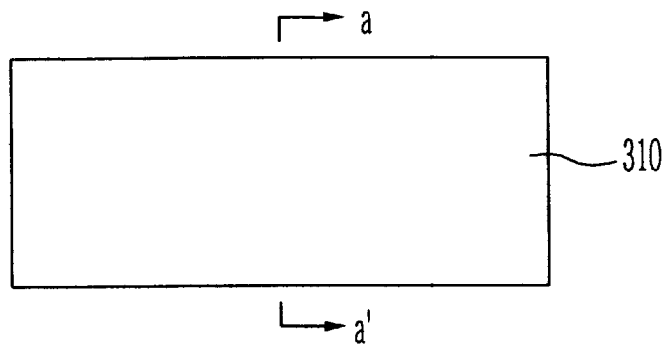
FIG. 3A~FIG. 11B are cross-sectional views of a semiconductor optical device for explaining a method of manufacturing the semiconductor optical device according to a preferred embodiment of the present invention.
Figure 3B:
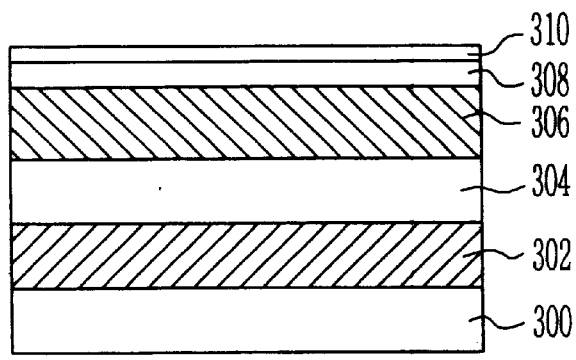

Referring now to FIG. 3A and FIG. 3B, a n-InGaAsP ($\lambda_{PL}$=1.18 μm) layer being a first waveguide layer 302, a n-InP layer being a first clad layer 304, an undoped InGaAsP ($\lambda_{PL}$=1.55 μm) layer being a second waveguide layer 306, and a p-InP layer being a second clad layer 308 are sequentially grown on an InP semiconductor substrate 300. For the purpose of a mask for lithography, a first hard mask 310 is formed by means of PECVD (plasma enhanced chemical vapor deposition) method. It is preferred that the first hard mask 310 is formed using a silicon nitride film ($SiN_x$). Further, it is preferred that the InGaAsP ($\lambda_{PL}$=1.18 μm) layer being the first waveguide layer 302 has the thickness of about 0.1~0.3 μm. It is preferred that the InGaAsP ($\lambda_{PL}$=155 μm) layer being the second waveguide layer 306 is formed on a location of about 0.1~0.7 μm spaced from the first waveguide layer 302 and has the thickness of about 0.1~0.4 μm. Meanwhile, it is preferred that an lnGaAsP ($\lambda_{PL}$=1.3 μm) layer (not shown) of about 0.1 μm in thickness is formed on upper and lower sides of the second waveguide layer 306 so that the second waveguide layer 306 is surrounded with the InGaAsP ($\lambda_{PL}$=1.3 μm) layer, for separate confinement heterostructure (SCH) and uniform gain depending on polarization.

Figure 4A:
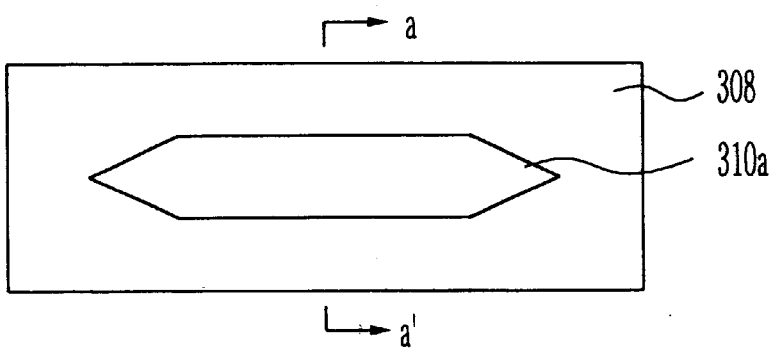
Figure 4B:
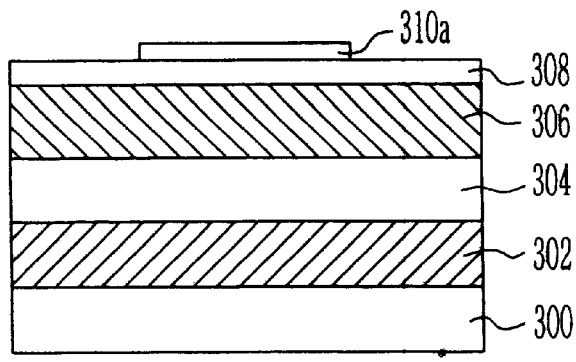

Referring now to FIG. 4A and FIG. 4B, a first photoresist pattern(not shown) having a taper type is formed at both sides of the first hard mask 310. Next, the first hard mask 310 is etched by means of magnetically enhanced reactive ion etching (hereinafter, called 'MERIE') method using the first photoresist pattern as an etch mask, thus forming a first hard mask pattern 310a that is patterned in a taper type, both ends of which are narrowed. Then, the first photoresist pattern is removed.

Figure 5A:
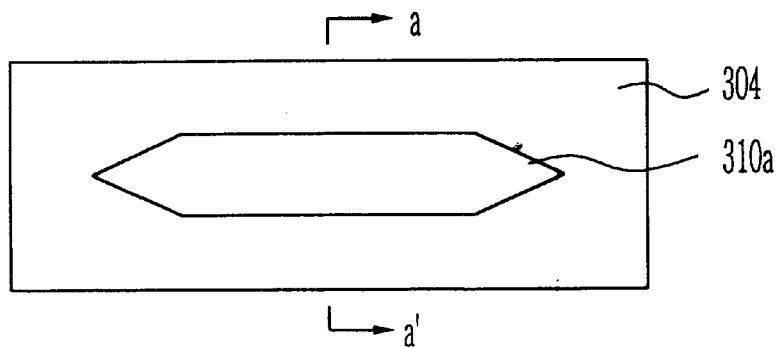
Figure 5B:
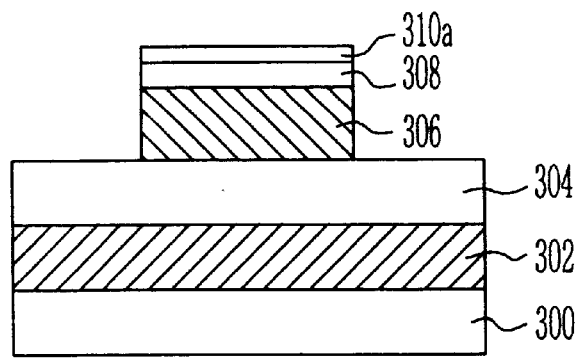

Referring now to FIG. 5A and FIG. 5B, the second clad layer 308 and the second waveguide layer 306 are etched using the first hard mask pattern 310a that is patterned in a taper type as an etch mask. The etching may include a wet etching process or a dry etching process having a etch selectivity.

Figure 6A:
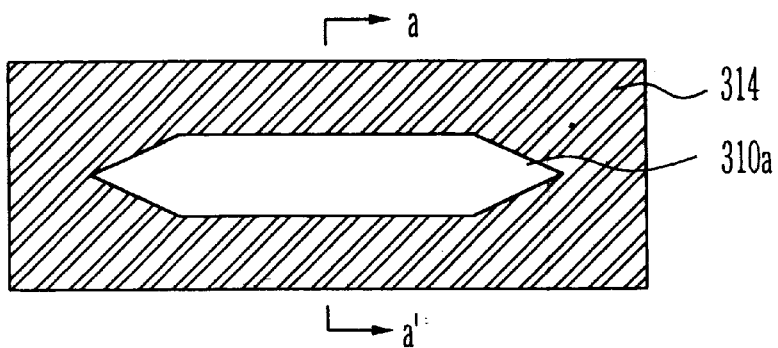
Figure 6B:
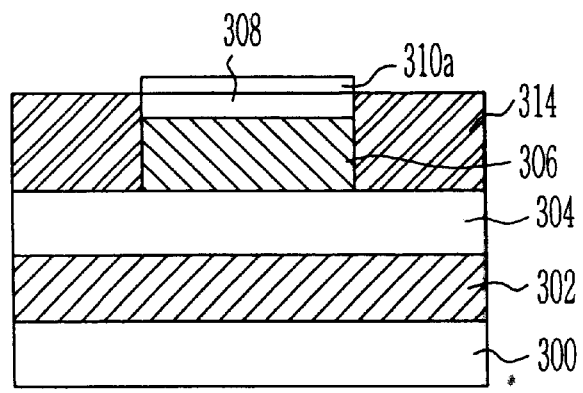

Referring now to FIG. 6A and FIG. 6B, an undoped InP layer 314 is selectively grown on a result from which the second clad layer 308 and the second waveguide layer 306 are etched, using the first hard mask pattern 310a as a selective mask. The undoped InP layer 314 is then flattened. At this time, it is preferred that the undoped InP layer 314 is grown in thickness of about 0.3~0.6 μm by means of metal organic chemical vapor deposition (hereinafter, called 'MOCVD') method. Further, it is preferred that an upper surface of the undoped InP layer 314 has the same level to an upper surface of the second clad layer 308.

Figure 7A:
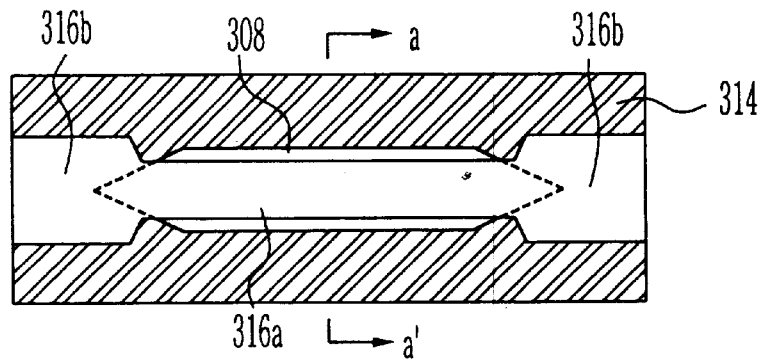
Figure 7B:
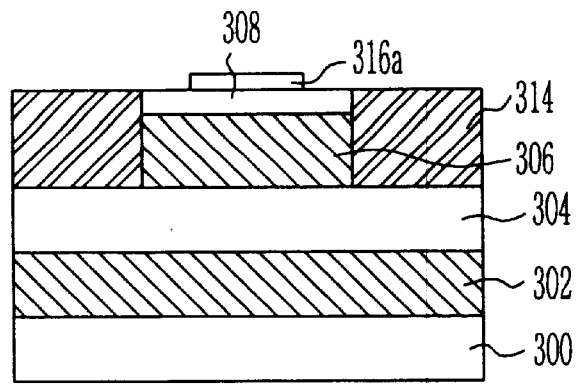

Referring now to FIG. 7A and FIG. 7B, the first hard mask pattern 310a is removed. A second hard mask is then deposited on the entire surface of the semiconductor substrate 300 from which the first hard mask pattern 310a is removed. It is preferable that the second hard mask is formed using a silicon nitride film. Next, a second photoresist pattern (not shown) is formed on the second hard mask. At this time, the width in the central portion of the second photoresist pattern is narrow than the width of an edge, and the width in the central portion of the second photoresist pattern is narrow than the width of the first photoresist pattern. Then, the second hard mask is etched by means of MERIE method using the second photoresist pattern as an etch mask, thus forming second hard mask patterns 316a and 316b. At this time, the width in the central portion 316a is narrow than that in the edge 316b, the width in the central portion 316a is narrow than the width (see FIG. 4A and FIG. 4B) of the first hard mask pattern 310a and a boundary of the central portion 316a and the edge 316b is patterned to have a taper type.

Figure 8A:
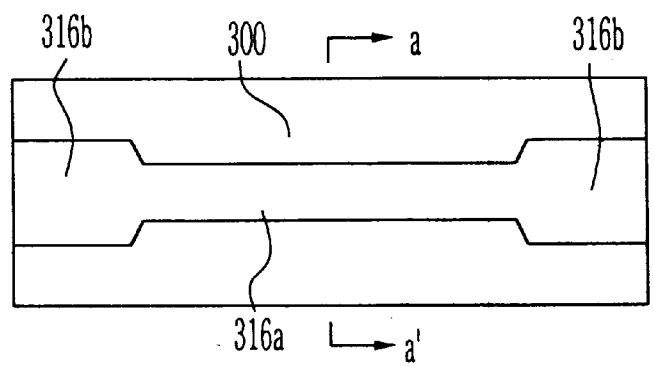
Figure 8B:
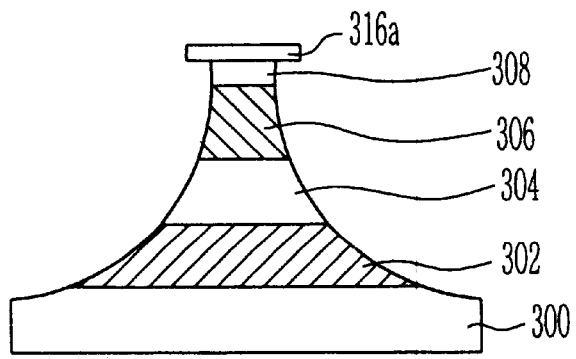
Figure 12:
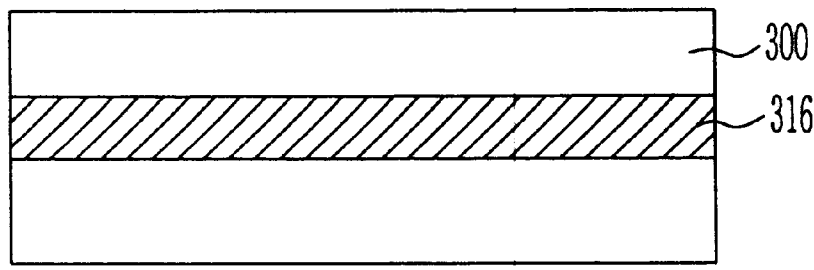
FIG. 12 shows an example in which a second hard mask pattern of a linear type with no change in the width is used as an etching mask.

Referring now to FIG. 8A and FIG. 8B, reactive ion etching method of up to about 1 μm in depth is performed using the second hard mask patterns 316a and 316b as an etch mask in order to increase the uniformity of the entire wafer. Next, etching is performed from the second clad layer 308 to the first waveguide layer 302 using wet etching solution. At this time, as the wet etching is isotropic etching, an edge of the semiconductor substrate 300 is recessed by some degree. In the above process, the shape of the second hard mask patterns 316a and 316b used in the self-alignment is very important. The width at the central portion 316a of the second hard mask patterns 316a and 316b determines the width of the second waveguide layer 306, that is the active layer 306, which is an important factor in the characteristic of the optical device. Further, formation of two waveguides having different widths is inevitable in the mode converter-integrated optical device. If the two waveguides are formed simultaneously using the self-aligned method the width of the edge 316b of the second hard mask patterns 316a and 316b is wider than the central portion 316a and the width of the waveguide at its boundary is tapered, thus obtaining the characteristic of the mode converter having the two waveguides of different widths. More simply, two independent waveguides can be formed using the self-aligned method. This is to make the second hard mask (see 316 in FIG. 12) to be a linear type pattern. However, though there is an advantage that the second hard mask (see FIG. 12) of the linear type pattern can be simplified, a method by which the width of the two waveguides can be controlled must be secured since the width of the two waveguides must be formed by a single photolithography and etching process.

Figure 13:
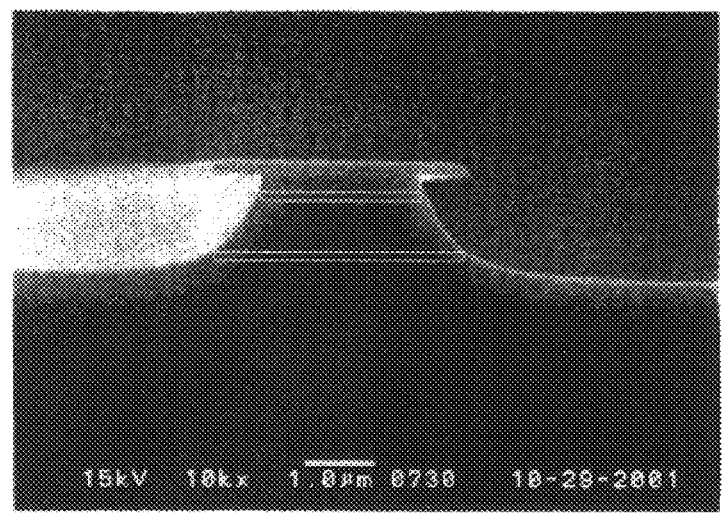
FIG. 13 is a cross-sectional SEM (scanning electron microscope) of a semiconductor optical device in which two waveguides are formed using wet etching process.

FIG. 13 is a cross-sectional SEM (scanning electron microscope) photography of the semiconductor optical device after the wet etching process. As can been seen from FIG. 13, in case that the substrate on which the first waveguide layer 302, the first clad layer 304, the second waveguide layer 306, the second clad layer 306 are grown is etched using the wet etching process, the width of the two waveguides 302 and 306 can be differently formed. Further, the ratio of the waveguide 302 to the waveguide 306 can be determined by varying the thickness of the InP layer being the first clad layer 304. Thus the optical device having a good performance can be obtained using a more simplified self-aligned method.

Meanwhile, the width of the InP layer 304 determining the widths of the two waveguides 302 and 306, that is variations in the coupling efficiency of the mode converter depending on the distance between the two waveguides 302 and 306 is very important in the characteristic of the optical device. Results of a three-dimensional simulation using beam propagation method (hereinafter, called 'BPM') for variations in the coupling efficiency of the mode converter depending on the thickness of the InP layer 304 is shown in FIG. 14.

Figure 14:
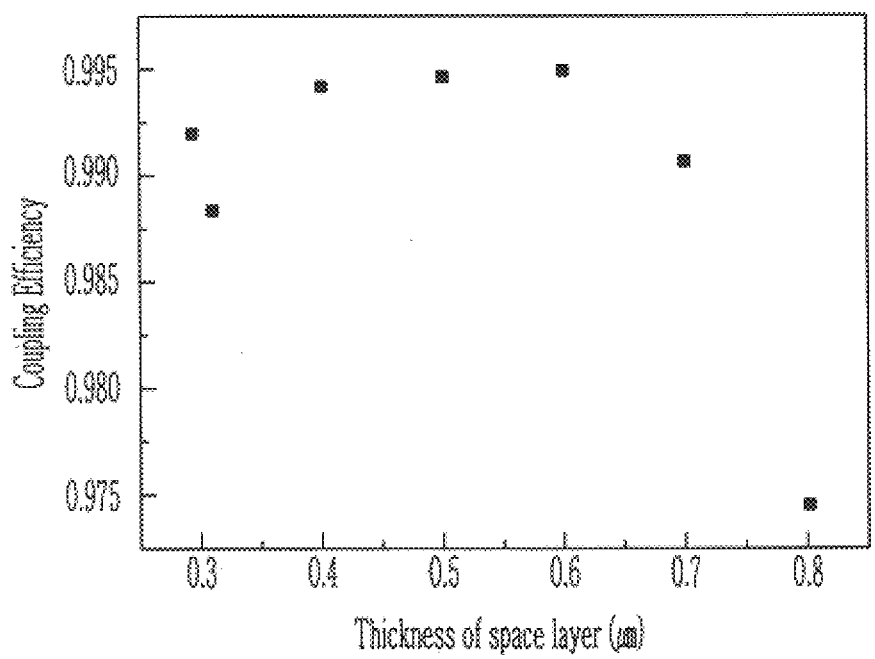
FIG. 14 shows a result of simulating the coupling efficiency of a mode converter depending on the thickness of an InP layer between two waveguides using a three-dimensional beam propagation method.

FIG. 14 shows a result of simulating a taper having the length of 200 μm in a three-dimensional BPM, to find an effect that the distance between input waveguide and output waveguide affect the coupling efficiency of the mode converter while the distance (g) between the input waveguide and the output waveguide is varied. In FIG. 14, the widths of the input waveguide(first waveguide 302) and output waveguide(second waveguide 306) are $W_{in}=3.0$ μm and $W_{out}=1.2$ μm, respectively. The thickness of the input waveguide(first waveguide 302) and the output waveguide (second waveguide 306) are $d_{in}=0.15$ μm and $d_{out}=0.35$ μm (including the SCH region), respectively. The width of an edge is below 0.2 μm. The distance (g) between the input waveguide and the output waveguide is in range of g=0.3 μm~g=0.8 μm. Passive and active type refractive index are $n_{in}=3.306$ and $n_{out}=3.55$, respectively. Further, the clad refractive index is $n_0=3.17$.

From FIG. 14, it can be seen that the characteristic of the mode converter having the coupling efficiency of over 95% in the taper having the length of 200 μm is not greatly affected by variations in the thickness of the InP layer 304. In other words, it can be seen that even though the thickness of the InP layer being the first clad layer 304 is thicker to be about 0.8 μm, it does not rarely affect the coupling efficiency. Based on this result, if the variable thickness of the InP layer 304 is applied, the width of the InGaAsP layer 302 waveguide used in the simulation can be obtained with repeatability. As such, the process can be simplified since the self-aligned method can be utilized regardless of the type of the waveguide.

Figure 9A:
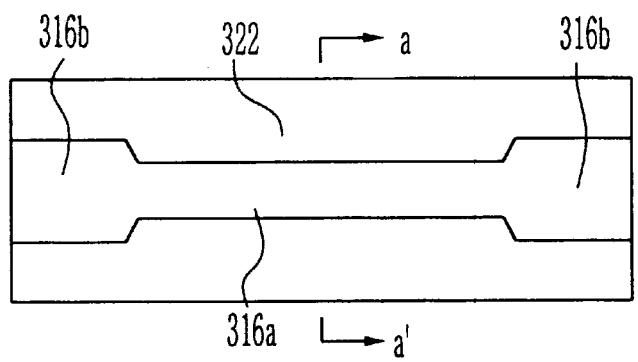
Figure 9B:
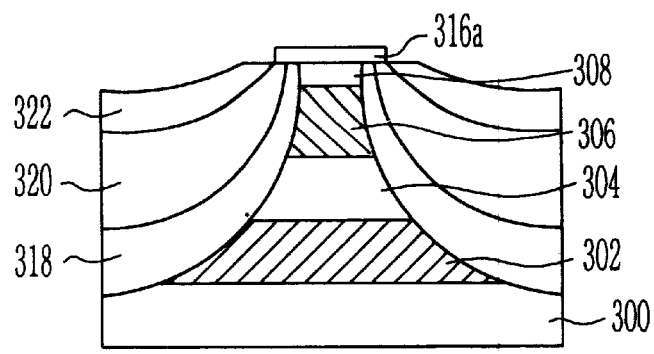

Referring now to FIG. 9A and FIG. 9B, a p-InP layer 318 being an electrical isolation layer, a n-InP layer 320 and a p-InP layer 322 are sequentially regrown in the semiconductor substrate 300 in which the two waveguides 302 and 306 are formed by means of MOCVD method using the self-aligned method and etching method. In this case, as current injection is performed into the second waveguide layer 306 being active layer only, the optical device having a good characteristic even at a high current injection situation can be manufactured.

Figure 10A:
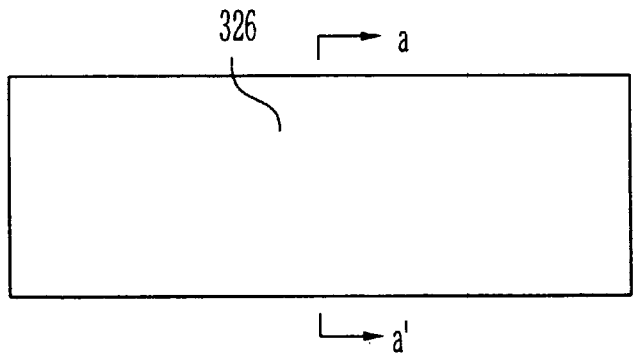
Figure 10B:
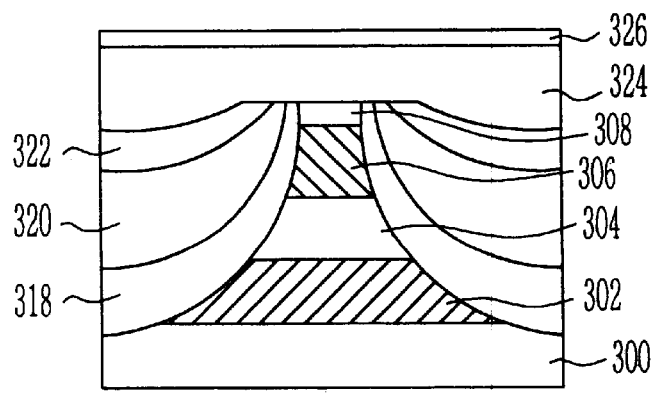

By reference to FIG. 10A and FIG. 10B, the second hard mask patterns 316a and 316b are removed. Similarly to the process of the active type optical device, an upper clad layer 324 and an electrically conductive layer 326 for high electrical conductivity are regrown by MOCVD method. The upper clad layer 324 is formed to be an InP layer into which a p type impurity is doped. The electrically conductive layer 326 is formed to be an InGaAs layer.

Figure 11A:
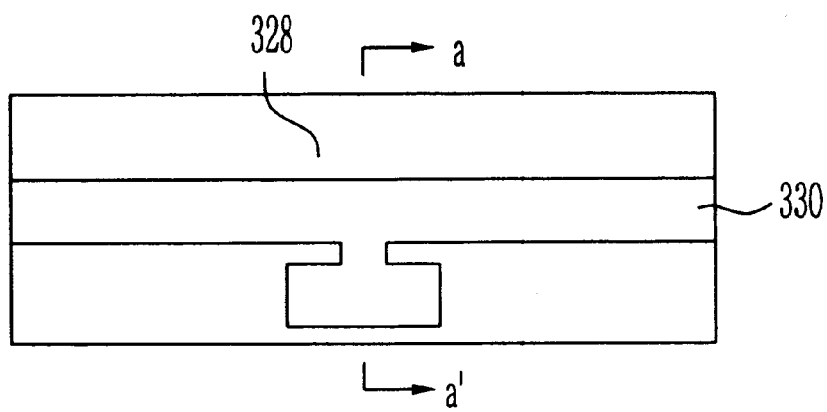
Figure 11B:
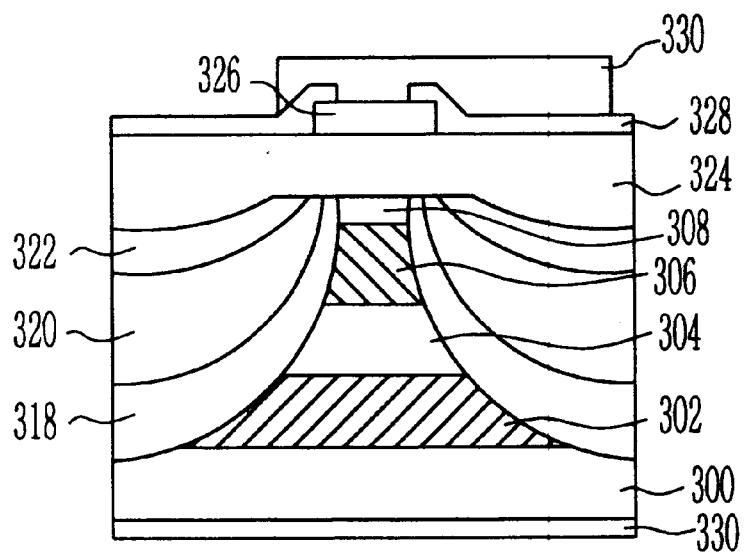

Referring to FIG. 11A and FIG. 11B, the electrically conductive layer 326 is patterned by means of photolithography and etching process so that current can be injected into only the active layer 306. Next, a silicon nitride film 328 is deposited on the entire surface of the semiconductor substrate 300 in which the patterned electrically conductive layer 326 is formed. Then, the silicon nitride film 328 is etched in order to connect the patterned electrically conductive layer 326 and the electrode 330 thus forming an opening portion. Therefore, a metal film is deposited and is then patterned to form an electrode 330.

In case of the semiconductor optical amplifier in which the mode converter is integrated, the mode converter having a good characteristic can be manufactured since the edge of the taper of the mode converter can be aligned at the center of the first waveguide 302, as shown in FIG. 7a. In addition, in the present invention, the photolithography is performed after the flattening process and the two waveguides are simultaneously manufactured using the self-aligned method. Thus, an error in the alignment between the two waveguides can be reduced. Further, the mode converter having good repeatability can be obtained and the yield can be improved, According to the present invention, a semiconductor optical device of a good PBH type can be obtained. Further, the present invention can fundamentally prevent the propagation loss of an optical wave traveling along the first waveguide due to free carrier of the clad layer into which a p type impurity is doped.

The present invention can secure repeatability by manufacturing two waveguides through a single lithography process using the self-aligned method. Also, the present invention can increase the yield of the semiconductor optical device as an error in the alignment between the mode converter and the waveguide is reduced.

Further, the present invention can save the manufacturing cost since the ion implanter is not required and conventional exposure can be used in tact In addition, the present invention can implement the mode converter-integrated optical device using existing contact type exposure equipment and wet etching method.

Also, the present invention can reduce the time and cost upon packaging. Incidentally, the present invention can prevent degradation in the characteristic of the optical device due to a reflecting light by reducing the cross-sectional reflecting index by means of a mode expanded by a mode conversion. Thus, the present invention can be applied to the field of an optical device packaging and single integration.

The present invention has- been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor optical device, comprising the steps of:
   sequentially forming a first waveguide layer, a first clad layer, a second waveguide layer and a second clad layer on a semiconductor substrate;
   depositing a first hard mask on the second clad layer and then forming a first hard mask pattern having a taper shape at both ends;
   etching the second clad layer and the second waveguide layer using the first hard mask pattern as an etch mask;
   selectively growing an undoped InP layer at regions from which the second clad layer and the second waveguide layer are etched using the first hard mask pattern as a selective mask and then flattening the undoped InP layer;
   removing the first hard mask pattern;
   forming a second hard mask pattern the width of which is smaller than the width of the first hard mask pattern on a result from which the first hard mask is removed; and
   etching the undoped InP layer, the second clad layer, the second waveguide layer, the first clad layer and the first waveguide layer using the second hard mask pattern as an etch mask to simultaneously form a second waveguide layer and a first waveguide layer having different widths.

2. The method of manufacturing a semiconductor optical device as claimed in claim 1, further comprising the steps of:
   forming an electrical isolation layer at regions where the undoped InP layer, the second clad layer, the second waveguide layer the first clad layer and the first waveguide layer are etched;
   removing the second hard mask pattern;
   forming an upper clad layer on a result from which the second hard mask pattern is removed;
   depositing an electrically conductive layer on the upper clad layer and then patterning the electrically conductive layer in order to inject current into the second waveguide layer;
   forming a silicon nitride film on a result in which the electrically conductive layer is pattern and then etching the silicon nitride film in order to electrically connect the electrically conductive layer and an electrode, thus forming an opening portion; and
   forming an electrode electrically connected to the electrically conductive layer.

3. The method of manufacturing a semiconductor optical device as claimed in claim 2, wherein said electrical isolation layer is formed by growing an InP layer in a p/n/p type.

4. The method of manufacturing a semiconductor optical device as claimed in claim 1, wherein said first waveguide layer is formed to be a n-InGaAsP layer, said second waveguide layer is formed to be an undoped InGaAsP layer, said first clad layer is formed to be a n-InP layer, and said second clad layer is formed to be a p-InP layer.

5. The method of manufacturing a semiconductor optical device as claimed in claim 1, wherein an InGaAsP layer is further formed at lower and upper sides of the second waveguide layer for separate confinement heterostructure and uniform gain depending on polarization.

6. The method of manufacturing a semiconductor optical device as claimed in claim 1, wherein the widths at the central portion and edge of said second hard mask pattern are different, the width at the edge of the second hard mask pattern is wider than the width at the central portion of the second hard mask pattern, the width of the central portion of the second hard mask pattern is narrower than the width of the fist hard mask pattern and the boundary at the central portion and the edge of the second hard mask pattern is tapered.

7. The method of manufacturing a semiconductor optical device as claimed in claim 1, wherein the etching process using the second hard mask pattern as an etch mask includes performing a dry etching process to a given depth and then performing a wet etching process.

8. The method of manufacturing a semiconductor optical device as claimed in claim 1, wherein said first and second hard masks are formed to be a silicon nitride film.

* * * * *